United States Patent
Gupta et al.

(10) Patent No.: US 11,678,466 B2
(45) Date of Patent: Jun. 13, 2023

(54) HEAT SINK FOR OPTICAL MODULE

(71) Applicant: CISCO TECHNOLOGY, INC., San Jose, CA (US)

(72) Inventors: Rohit Dev Gupta, Bangalore (IN); Narasimha Reddy Emmareddy, Bangalore (IN); Manjunatha Reddy Shivashankara, Bangalore (IN); Suresh Kumar Vadivazhagan, Bangalore (IN); Giovanni Giobbio, Rovellasca (IT)

(73) Assignee: CISCO TECHNOLOGY, INC., San Jose, CA (US)

( * ) Notice: Subject to any disclaimer, the term of this patent is extended or adjusted under 35 U.S.C. 154(b) by 87 days.

(21) Appl. No.: 17/329,043

(22) Filed: May 24, 2021

(65) Prior Publication Data

US 2022/0141990 A1 May 5, 2022

Related U.S. Application Data

(60) Provisional application No. 63/109,000, filed on Nov. 3, 2020.

(51) Int. Cl.
*H05K 7/20* (2006.01)
*H01R 13/516* (2006.01)
*G02B 6/42* (2006.01)

(52) U.S. Cl.
CPC ......... *H05K 7/2039* (2013.01); *H01R 13/516* (2013.01); *G02B 6/4269* (2013.01)

(58) Field of Classification Search
CPC ............ H05K 7/2039; H05K 7/20409; H05K 7/2049; H05K 7/20445; H01R 13/516; H01R 13/518; G02B 6/4269; G02B 6/4278; G02B 6/4268
See application file for complete search history.

(56) References Cited

U.S. PATENT DOCUMENTS

| | | | |
|---|---|---|---|
| 6,086,387 A * | 7/2000 | Gallagher | G01R 1/0483 439/71 |
| 7,347,711 B1 * | 3/2008 | Bianchini | G02B 6/4201 439/357 |
| 7,712,980 B2 | 5/2010 | Tokita | |
| 7,733,652 B2 | 6/2010 | Costello | |

(Continued)

OTHER PUBLICATIONS

High-Reliability Spring-Loaded Connectors for Sliding or Rotating Blind Mating Uses Introduced By Mill-Max, Military & Aerospace Electronics, Jun. 12, 2020.

*Primary Examiner* — Adam B Dravininkas

(57) ABSTRACT

In one embodiment, an apparatus includes a heat sink for attachment to an optical module cage configured for receiving an optical module, a thermal interface material attached to a surface of the heat sink for thermal contact with the optical module, and a plurality of lifting elements extending from the surface of the heat sink. The lifting elements are configured to create a gap between the thermal interface material and the optical module during insertion of the optical module into the optical module cage or removal of the optical module from the optical module cage, the plurality of lifting elements positioned for insertion into aligned recesses in the optical module when the optical module is fully inserted into the optical module cage to eliminate the gap and provide contact between the optical module and the thermal interface material.

21 Claims, 14 Drawing Sheets

(56) References Cited

U.S. PATENT DOCUMENTS

| | | |
|---|---|---|
| 8,217,558 B2 | 7/2012 | Bancken |
| 8,427,837 B2 | 4/2013 | Nguyen |
| 8,535,787 B1 | 9/2013 | Lima |
| 8,760,870 B2 * | 6/2014 | Yamamoto ........... G02B 6/4201 |
| | | 361/728 |
| 8,876,412 B2 | 11/2014 | Aoki |
| 8,911,244 B2 * | 12/2014 | Elison ................ H05K 7/20409 |
| | | 439/137 |
| 9,453,972 B1 | 9/2016 | Arvelo |
| 10,295,767 B2 | 5/2019 | Chen |
| 10,401,581 B2 | 9/2019 | Gaal |
| 10,690,868 B1 | 6/2020 | Goergen |
| 2003/0171016 A1 * | 9/2003 | Bright .................. G02B 6/4261 |
| | | 439/160 |
| 2009/0296351 A1 * | 12/2009 | Oki ...................... G02B 6/4246 |
| | | 361/709 |
| 2012/0127665 A1 | 5/2012 | Del Prete |
| 2012/0168122 A1 * | 7/2012 | Skepnek ............... H01L 23/433 |
| | | 165/80.2 |
| 2012/0300407 A1 * | 11/2012 | Yamamoto ........... G02B 6/4201 |
| | | 361/715 |
| 2014/0170898 A1 * | 6/2014 | Elison ................ H05K 7/20409 |
| | | 439/487 |
| 2015/0075755 A1 | 3/2015 | Arvelo |
| 2015/0092354 A1 | 4/2015 | Kelty |
| 2017/0269314 A1 | 9/2017 | Gaal |
| 2018/0129001 A1 | 5/2018 | Van Gaal |

* cited by examiner

HEAT SINK FOR OPTICAL MODULE

STATEMENT OF RELATED APPLICATION

The present application claims priority from U.S. Provisional Application No. 63/109,000 entitled HIGH POWER QSFP-DD OPTICS COOLING ARRANGEMENT, filed on Nov. 3, 2020, the contents of which are incorporated herein by reference in its entirety.

TECHNICAL FIELD

The present disclosure relates generally to a heat transfer interface between a heat sink and a field replaceable module, and more particularly, to preventing damage to the heat transfer interface during insertion or removal of the field replaceable module.

BACKGROUND

Due to exponential rise in bandwidth, capacity per Rack Unit (RU) has become a critical parameter for system efficiency. As a result, Quad Small Form-factor Pluggable Double Density (QSFP-DD) optical transceiver modules are getting more popular as they provide maximum capacity within a small volume. Due to the high power density of these modules, cooling of the modules is very challenging.

Cooling efficiency of optical modules may be improved by introducing a thermal interface material (TIM) between a heat sink and the optical module, but there is a risk of TIM damage during module online insertion and removal (OIR) in which a module is removed and replaced in the field due to a faulty module or to upgrade the module to a higher performance device.

BRIEF DESCRIPTION OF THE FIGURES

Corresponding reference characters indicate corresponding parts throughout the several views of the drawings.

DESCRIPTION OF EXAMPLE EMBODIMENTS

Overview

Figure 1:
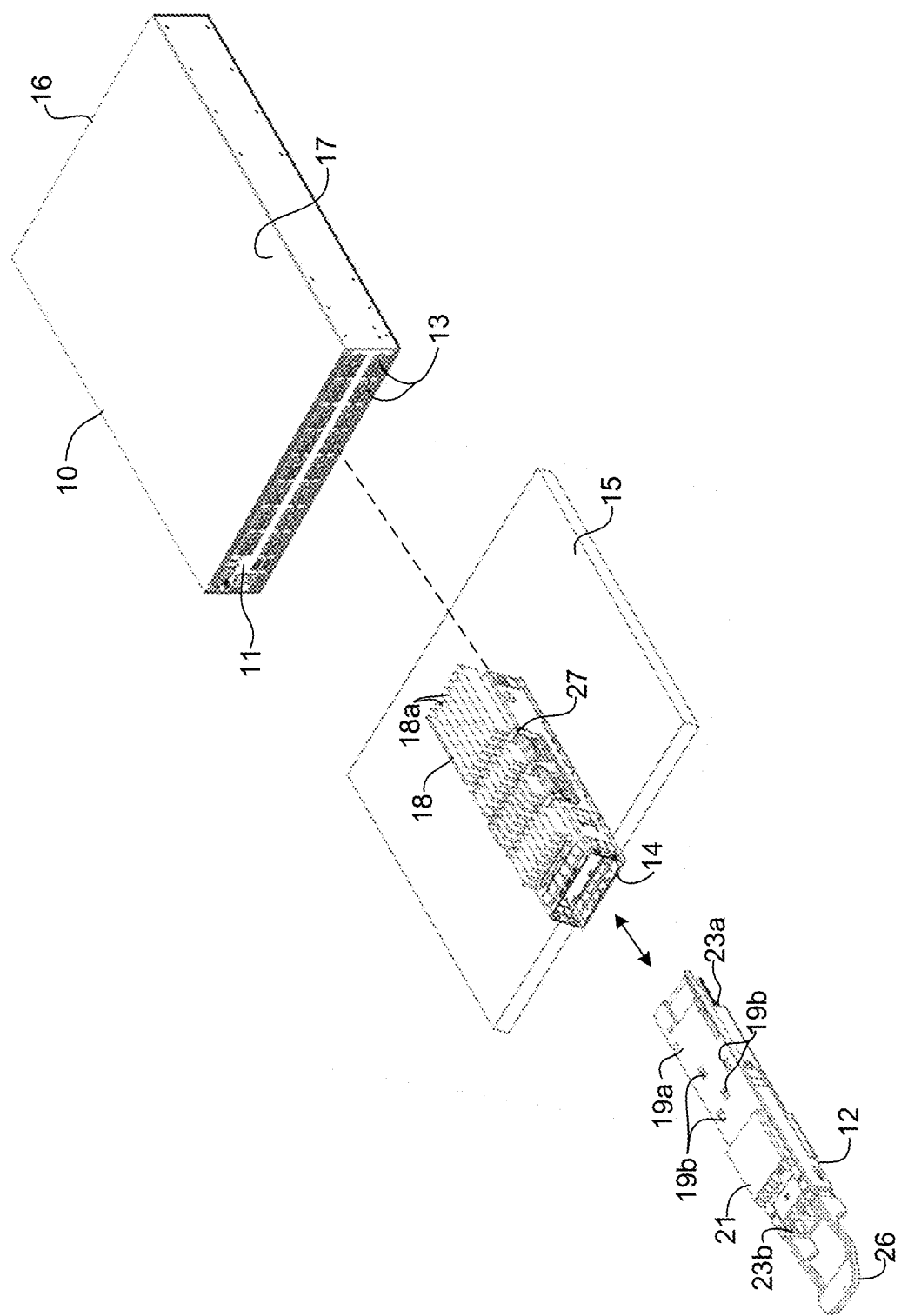
FIG. 1 illustrates an example of a network device with an exploded view of an optical module cage with heat sink mounted on a printed circuit board and optical module for insertion into the optical module cage, in accordance with one embodiment.

In one embodiment, an apparatus generally comprises a heat sink for attachment to an optical module cage configured for receiving an optical module, a thermal interface material attached to a surface of the heat sink for thermal contact with the optical module, and a plurality of lifting elements extending from the surface of the heat sink. The lifting elements are configured to create a gap between the thermal interface material and the optical module during insertion of the optical module into the optical module cage or removal of the optical module from the optical module cage, and are positioned for insertion into aligned recesses in the optical module when the optical module is fully inserted into the optical module cage to eliminate the gap and provide contact between the optical module and the thermal interface material.

In one or more embodiments, the heat sink comprises a pedestal and at least one of the lifting elements is positioned along an edge of the pedestal. The remaining lifting elements extend through openings in the thermal interface material.

In one or more embodiments, the lifting elements comprise at least four lifting elements.

In one or more embodiments, the lifting elements are offset from one another along a width of the heat sink.

In one or more embodiments, the recesses comprise sloped edges for ease of insertion of the lifting elements into the recesses and removal of the lifting elements from the recesses during insertion and removal of the optical module.

In one or more embodiments, at least one of the lifting elements or the optical module comprises a coating to reduce sliding friction between the lifting elements and the optical module.

In one or more embodiments the lifting elements comprise a plurality of wedge elements and the recesses comprise grooves.

In one or more embodiments, the lifting elements comprise ball elements and the recesses comprise dimples. In one or more embodiments, the ball elements comprise spring loaded ball elements. In one or more embodiments, the ball elements comprise rolling ball elements. In one or more embodiments, the ball elements are inserted into a cartridge press-fit into the heat sink. In one or more embodiments, the ball elements are inserted into a cartridge comprising a threaded interface with the heat sink.

In one or more embodiments, the heat sink comprises fins extending from a side opposite the thermal interface material.

In another embodiment, a system generally comprises a heat sink connected to a cage, a thermal interface material extending over at least a portion of a surface of the heat sink, a plurality of lifting elements extending from the surface of the heat sink, and a module for insertion into the cage. The module comprises a thermal surface for contact with the thermal interface material with the module fully inserted into the cage and a plurality of recesses formed in the thermal surface. The lifting elements prevent contact between the thermal interface material and the thermal surface of the module during insertion of the module into the cage or removal of the module from the cage. The recesses are positioned for receiving the lifting elements when the module is fully inserted into the cage to provide direct contact between the thermal interface material and the thermal surface of the module.

In yet another embodiment, a network device generally comprises a plurality of optical module cages and a plurality of heat sinks connected to the optical module cages, each of the heat sinks comprising a thermal interface material on a surface of the heat sink for thermal contact with a surface of an optical module when the optical module is fully inserted into one of the optical module cages, and a plurality of lifting elements extending from the surface of the heat sink. The lifting elements are configured to create a gap between the thermal interface material and the optical module during insertion of the optical module into the optical module cage or removal of the optical module from the optical module cage, and positioned for insertion into aligned recesses in the optical module when the optical module is fully inserted into the optical module cage to eliminate the gap and provide contact between the optical module and the thermal interface material.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

As networking performance requirements increase, optical modules (also referred to as optical transceivers, pluggable modules, or field replaceable modules) continue to increase in speed and power, while space available to house the modules has decreased. Optical modules are thus dissipating more power in smaller form factors than conventional components. As optical power dissipation increases, cooling of optical components is becoming very difficult.

Cooling efficiency of optical modules may be improved through use of a heat sink and introduction of a thermal interface material (TIM) between the heat sink and the optical module. Since metal surfaces (e.g., lower surface of heat sink, upper surface of optical module) may have surface irregularities (e.g., flatness irregularities, waviness irregularities, roughness irregularities), air gaps may form between the metal surface of the heat sink and the optical module. These air gaps at the interface of the heat sink and optical module are detrimental to heat transfer due to the low thermal conductivity of air and lead to higher thermal resistance. The TIM provides a heat transfer interface between the heat sink and optical module and may reduce or eliminate these air gaps. The TIM thus significantly improves heat transfer for high power optics such as QSFP-DD ZR+ or other form factor optical transceiver modules.

In conventional systems, when the optical module is inserted into an optical module cage comprising the heat sink and TIM, the thermal interface material engages the optical module to thermally couple the module to the heat sink. A retention clip may be used to bias the heat sink against the optical module, thereby ensuring sufficient contact pressure at the interface when the optical module is inserted into the optical module cage. A problem arises, however, as the optical module is inserted or removed because contact between the thermal interface material and the optical module may damage the thermal interface material, which may impact performance of the thermal interface material, create difficulty in insertion of the optical module into the optical module cage or removal of the optical module from the optical module cage, or make equipment unusable if the damaged particles of the thermal interface material gets into the electrical connector of the equipment and impacts the electrical connection between the equipment and the module.

The embodiments described herein provide lifting of the heat sink during online insertion and removal (OIR) to prevent TIM damage without requiring any user intervention (i.e., passive solution). As described in detail below, lifting of the heat sink may be provided through the use of lifting elements, which may include a wedge profile for die cast/machined parts, circular dimples/emboss on metal sheets (as in vapor chamber designs), or press-fit inserts (e.g., ball or plunger design). Different profiles may be used to minimize sliding resistance. Special coatings may also be used to improve sliding friction. As the optical module is inserted into the optical module cage, the lifting elements on the heat sink provide upward movement of the heat sink to prevent TIM damage. When the optical module is fully inserted (seated), the lifting elements snap into corresponding recesses formed in a thermal interface surface (e.g., top cover) of the optical module. As described below and shown in the drawings, the recesses are offset from one another so that the lifting elements do not snap into multiple recesses as the module slides into or out of the cage. Prevention of TIM damage during optical module OIR provides improved thermal management and optical module reliability. The lifting elements provide upward movement of the heat sink and TIM to prevent sliding contact between the optical module and TIM to prevent TIM damage with no user intervention, thereby providing multi-source agreement (MSA) compliant solutions that minimize cost.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. One or more of the network devices may comprise one or more optical module cages with the heat sinks described herein. The network device may include one or more processor, memory, and network interfaces, with one or more of these components located on a line card removably inserted into the network device. The network devices may communicate over or be in communication with one or more networks, which may include any number or arrangement of network communications devices (e.g., switches, access points, routers, or other devices) operable to route (switch, forward) data communications.

Referring now to the drawings, and first to FIG. 1, an example of a network device 10 (e.g., computing apparatus, line card) and a replaceable module 12 (e.g., optical module, optical transceiver, pluggable module, field replaceable module) that may be installed in the network device is shown. The optical module 12 is inserted into an optical module cage 14, shown mounted on a printed circuit board (PCB) 15 with heat sink 18 in an exploded view in FIG. 1.

Figure 2:
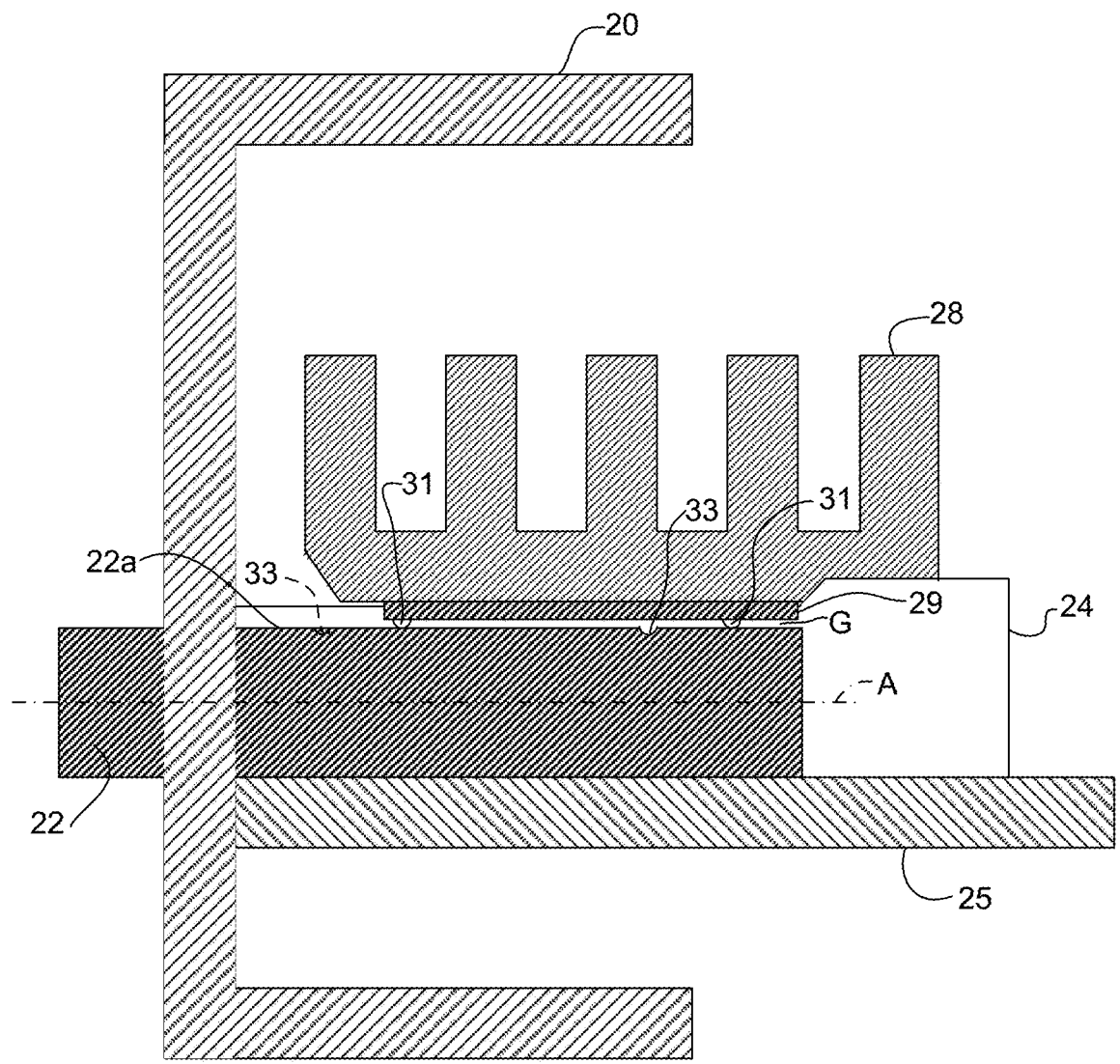
FIG. 2 is a cross-sectional schematic of the components shown in FIG. 1.

In one or more embodiments, the network device 10 comprises a plurality of optical module cages 14 and a plurality of heat sinks 18 connected to the optical module cages, each of the heat sinks comprising a thermal interface material on a surface of the heat sink (shown in FIG. 2) for thermal contact with a surface 19a of the optical module 12 when the optical module is fully inserted (seated, properly installed) in the optical module cage, and a plurality of lifting elements extending from the surface of the heat sink (shown in FIG. 2). As described in detail below, the lifting elements are configured to create a gap between the thermal interface material on the heat sink 18 and the optical module 12 during insertion of the optical module into the optical module cage 14 or removal of the optical module from the optical module cage. The lifting elements are positioned for insertion into aligned recesses 19b in the optical module when the optical module is fully inserted in the optical module cage to eliminate the gap and provide contact between the optical module and the thermal interface material.

The network device 10 includes a front surface or panel 11 with a plurality of openings (ports) 13 that provide access to optical module cages 14 defined therein. FIG. 1 shows an exploded view of one of the optical module cages 14 mounted on the printed circuit board 15 and the optical module 12 that may be removably inserted into the optical module cage. In one example, the optical module cage 14 extends from the front panel 11 towards a back end of a housing 16 and is positioned to be substantially flat within the housing, such that the optical module cage is generally parallel to a cover 17 that defines of top of the housing.

It should be noted that the terms lower, upper, bottom, top, below, above, horizontal, vertical, and the like, which may be used herein are relative terms dependent upon the orientation of the network device and components and should not be interpreted in a limiting manner. These terms describe points of reference and do not limit the embodiments to any particular orientation or configuration.

Also, it is to be understood that the term "optical module" as used herein refers to any modular component (e.g., optical transceiver module, pluggable module, field replaceable module) configured for insertion into and removal from a modular electronic system, which may include a line card, stand-alone device, or any other network device. The network device 10 may comprise, for example, a line card (e.g., line card, fabric card, route processor card, controller card, and the like), rack server, or any other network device configured to receive one or more modules (field replaceable units). The network device 10 may include any number of ports 13 for receiving any number or type of optical modules 12 in any arrangement.

The optical module cage 14 includes an open top that allows the heat sink 18 to access and engage the upper surface 19a (heat transfer surface, thermal interface surface) of the optical module 12 when installed in the optical module cage 14. As previously noted, a retention clip 27 may be used to bias the heat sink 18 against the optical module 12 when the optical module is installed in the optical module cage 14. With the optical module 12 inserted into the network device 10, airflow enters at the front face 11 of the network device and passes rearward over the heat sink 18 towards the inserted end of the optical module. In the example shown in FIG. 1, the heat sink 18 comprises a plurality of heat sink fins 18a extending from a surface opposite the heat sink surface comprising the thermal interface material. It is to be understood that the heat sink 18 shown in FIG. 1 is only an example and the heat sink may include any number, shape, size, or orientation of fins in any format. In one or more embodiments, the optical module 12 may also include a heat sink 21 on the upper surface 19a at a front end (nose) of the optical module extending from the network device with the optical module fully inserted into the optical module cage 14. In the examples described herein, the upper surface 19a of the optical module 12 is a heat transfer surface for the optical module, however, it is to be understood that any surface of the optical module may operate as a heat transfer (thermal interface) surface.

The optical module 12 may be plugged into a module based switch, router, or other optical platform port (e.g., network device 10). A cable (not shown in FIG. 1) connected to the optical module 12 at an optical connector may carry, for example, data (e.g., fiber optics, optical array, fabric). The optical transceiver module 12 operates as an engine that bidirectionally converts optical signals to electrical signals or in general as an interface to a network element copper wire or optical fiber. A host for the pluggable optical module may include the network device 10 comprising the printed circuit board 15 and electronic components and circuits operable to interface telecommunications lines in a telecommunications network. The host may be configured to perform one or more operations and receive any number or type of pluggable transceiver modules configured for transmitting and receiving signals.

The optical module 12 comprises a first end 23a for insertion into the network device 10 and a second end 23b extending from the network device when the optical module is inserted into the network device. The first end 23a of the optical module 10 defines an electrical interface and the second end 23b of the optical module defines an optical interface between the optical module and one or more optical fibers. The first end 23a of the optical module 12 comprises an electrical connector (back end connector) (e.g., multiple contact edge type connector) for electrically coupling the optical module 10 to the network device (e.g., through optical module cage interface at the PCB 15) and the second end 23b of the optical module comprises one or more optical connectors (e.g., MPO (Multi-fibre Push On) connector or LC duplex connector). During insertion of the optical module 12 into the optical module cage 14, the connector on the back end of the optical module is coupled to a connector in the optical module cage (not shown in FIG. 1). The electrical connector may be configured to provide a Small Computer System Interface (SCSI) connection, Serial Attached SCSI (SAS) connection, an advanced technology attachment (ATA) connection, a Serial ATA (SATA) connection, or any other suitable type of connection.

The optical module 12 may include a handle 26, which may assist with insertion or removal of the optical module. As shown in FIG. 1, the handle may be generally U-shaped and extend outward from a front face of the optical module housing. The handle 26 may also be used to operate a latch mechanism to release the optical module. During removal of the optical module 12 from the optical module cage 14, the handle 26 (or other feature) may be used to pull the optical module from the cage. The optical module 12 may also be ejected or removed from the optical module cage using any other suitable means.

The optical module may be a pluggable transceiver module in any form factor (e.g., SFP (Small Form-Factor Pluggable), QSFP (Quad Small Form-Factor Pluggable), QSFP-DD, CFP (C Form-Factor Pluggable), QSFP-DD ZR+, CFP2, CXP (100G/Common Transceiver Pluggable), and the like) or any other current or future standard module. In one or more embodiments, the optical module housing may conform to industry standards packaging dimensions and may be formed from any suitable material.

It is to be understood that the network device 10, optical module 12, and optical module cage 14 shown in FIG. 1 are only examples, and other formats, shapes, sizes, or arrangements may be used, without departing from the scope of the embodiments.

FIG. 2 schematically illustrates insertion of an optical module 22 into an optical module cage 24 and a gap G between a thermal interface material (TIM) 29 and an upper surface (thermal surface) 22a of the optical module created by a lifting system comprising a plurality of lifting elements 31 (e.g., balls, wedges, or any other shaped element) to prevent contact between the optical module and the TIM during insertion and removal of the optical module.

In one or more embodiments, a system comprises a heat sink 28 connected to the optical module cage 24, a thermal interface material 29 extending over at least a portion of a surface of the heat sink, a plurality of lifting elements 31 extending from the surface of the heat sink, and the module 22 for insertion into the cage. The module comprises the thermal surface 22a for contact with the thermal interface material 29 with the module fully inserted (seated, properly installed) in the cage 24, and a plurality of recesses 33 formed in the thermal surface. The lifting elements 31 prevent contact between the thermal interface material 29 and the thermal surface 22a of the module 22 during insertion of the module into the cage 24 or removal of the module from the cage. The recesses 33 are positioned for receiving the lifting elements 31 when the module 22 is fully inserted into the cage 24 to provide direct contact between the thermal interface material 29 and the thermal surface 22a of the module.

As previously described, the network device 20 includes a housing that houses a PCB 25 and the optical module cage 24 (FIG. 2). The heat sink 28 comprising the TIM 29 is coupled to the optical module cage 24. The lifting elements 31 force the heat sink 28 and TIM 29 upward and away from the upper surface 22a of the optical module 22 to provide the gap G during insertion or removal of the optical module. The gap G allows the optical module 22 to be inserted into or removed from the optical module cage 24 without contacting or damaging the TIM 29. As described below, once the optical module 22 is fully inserted in the optical module cage 24, the lifting elements are received in the corresponding (aligned) recesses 33 (e.g., grooves, dimples, openings) and the heat sink 28 automatically lowers to its seated position with the TIM 29 in direct contact with the optical module 22. As described below, the recesses 33 on the optical module 22 are offset in a direction transverse to a longitudinal axis A of the optical module 22 along the upper surface 22a of the optical module so that each of the lifting elements 31 only align with its corresponding groove 33 with the optical module in its fully inserted position.

Figure 3A:
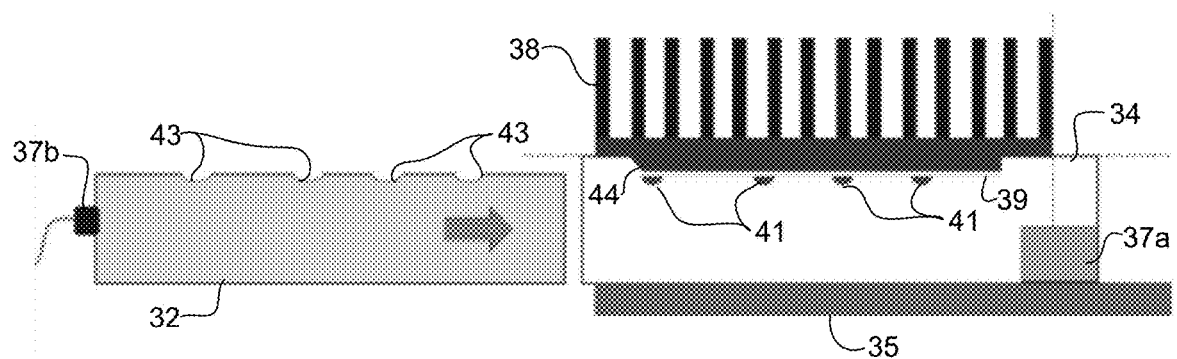
FIGS. 3A-3E are schematic diagrams illustrating insertion of the optical module into the optical module cage with lifting elements providing a gap between a Thermal Interface Module (TIM) on the heat sink and an upper surface of the optical module, in accordance with one embodiment.
Figure 3B:
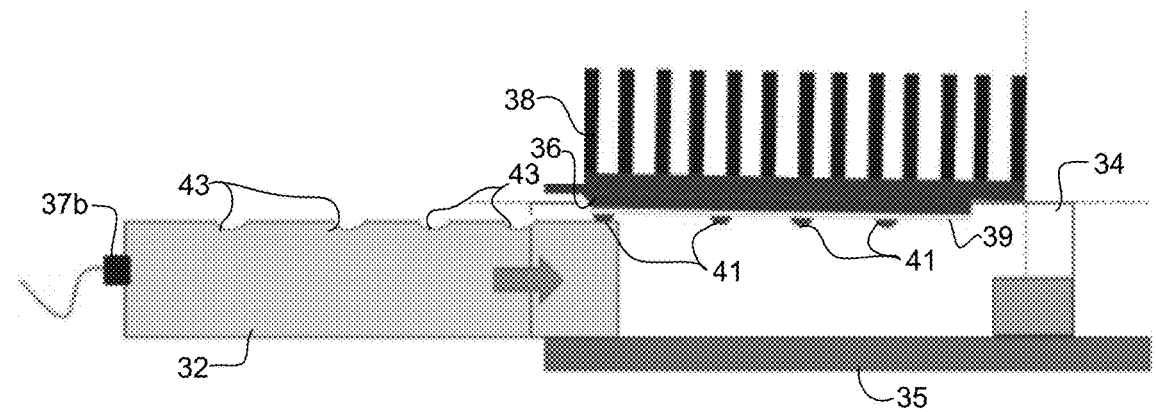

FIGS. 3A-3E schematically illustrate insertion of an optical module 32 into an optical module cage 34 and lifting of a heat sink 38 coupled to the optical module cage 34, in accordance with one embodiment. As previously described, the optical module cage 34 includes an electrical connector 37a for connection to the optical module 32 and the optical module comprises an optical port for receiving an optical connector 37b. As shown in FIG. 3A, the optical module 32 is aligned with an opening in the optical module cage 34. The heat sink 38 is in its lower (seated) position prior to insertion of the optical module 32 (FIG. 3A). The heat sink 38 includes a TIM 39 on its lower surface (as viewed in FIG. 3A) and lifting elements 41 (e.g., balls, wedges, plungers) extending downward from the lower surface. The optical module 32 comprises corresponding recesses 43 on its upper surface (as viewed in FIG. 3A).

Figure 3C:
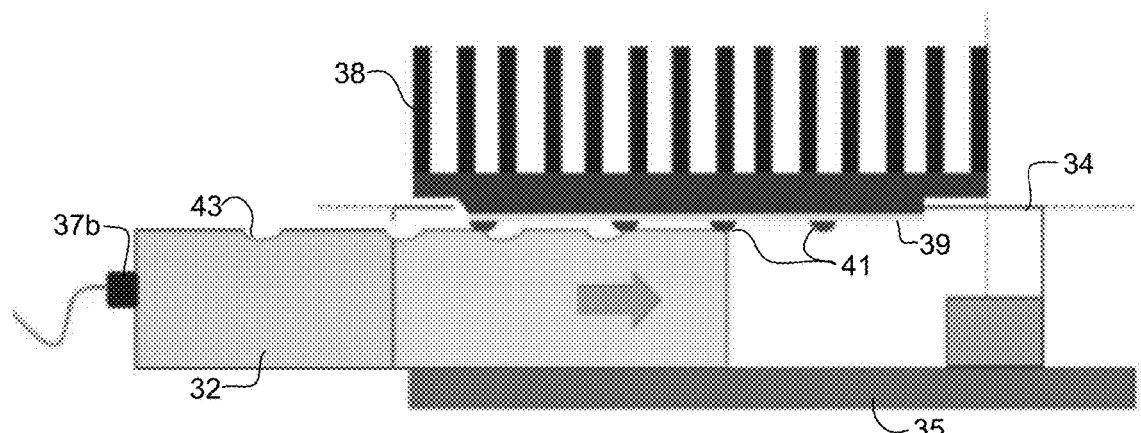
Figure 3D:
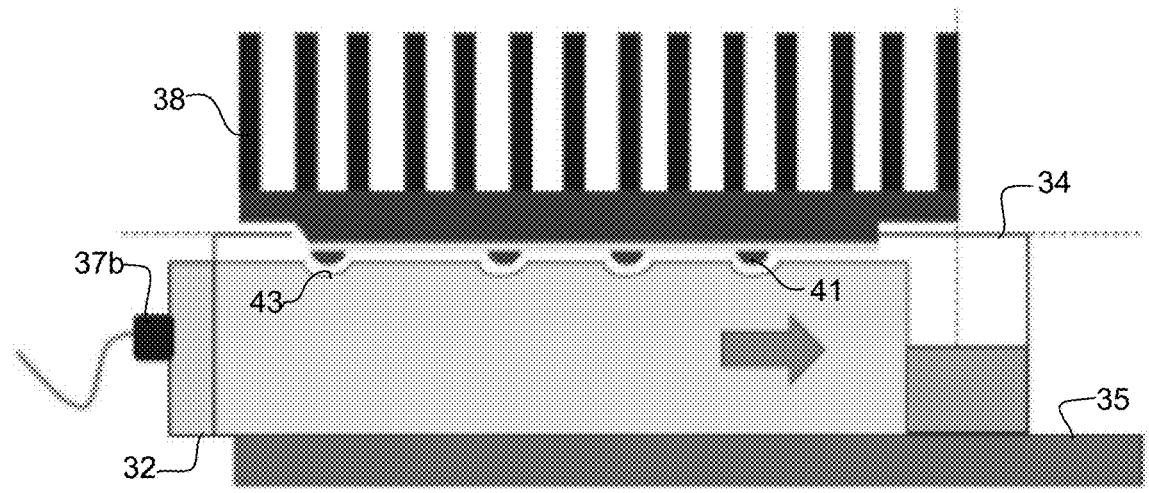

As the optical module 32 is inserted into the optical module cage 34 (FIG. 3B) a first lifting element on a front (leading) edge of a pedestal 36 of the heat sink 38 contacts the upper surface of the optical module 32 and begins to force the heat sink upward into its lifted position. As the optical module 32 moves into the optical module cage 34, the upper surface of the optical module contacts additional lifting elements 41, thereby forcing the heat sink 38 and attached TIM 39 upwards and preventing contact between the optical module and the TIM (FIG. 3C).

Figure 3E:
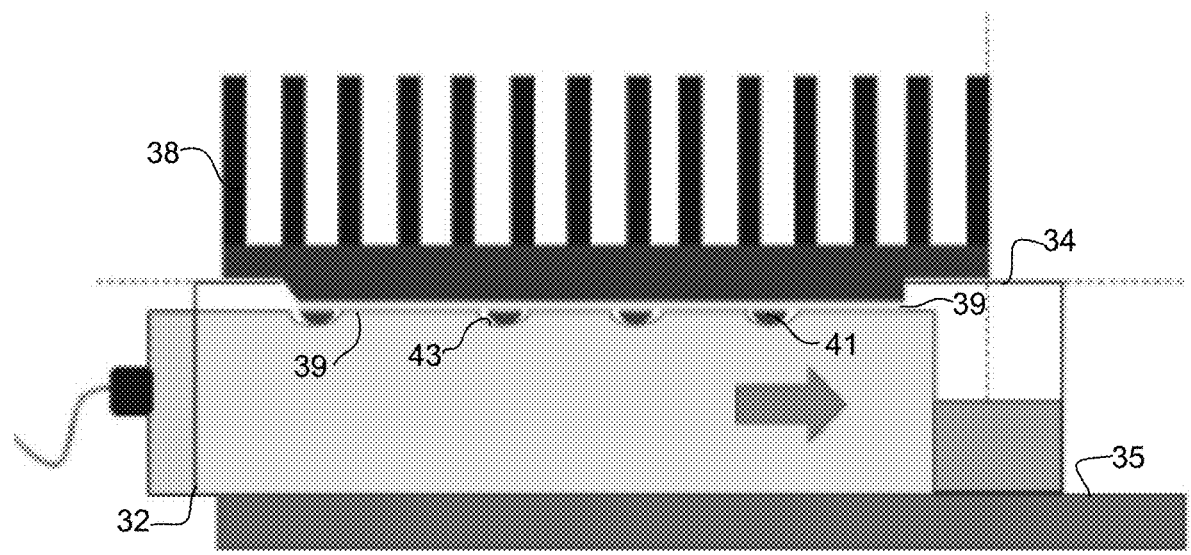

As the optical module reaches its final position (FIG. 3D), the lifting elements 41 are aligned with their corresponding recesses 43 on the optical module 32 and the heat sink 38, which may be biased downward as previously described, lowers to its final position with the lifting elements seated in the recesses (FIG. 3E). As previously noted, the lifting elements 41 are offset from one another along a width of the heat sink 38 so that each of the lifting elements 41 only aligns with its corresponding recess in the optical module 32 with the optical module in its fully inserted position.

Figure 4A:
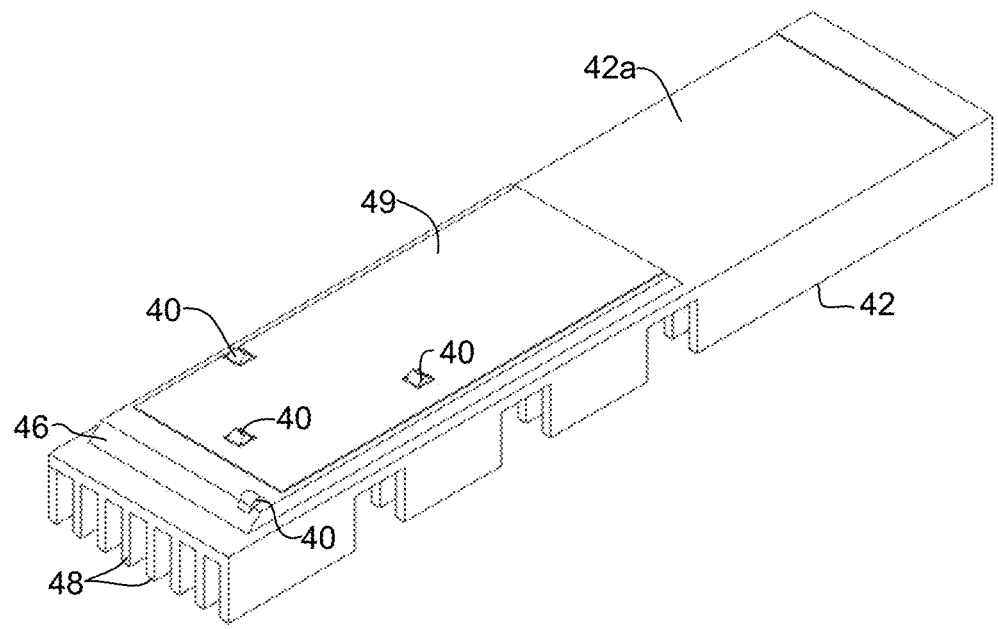
FIG. 4A is a bottom perspective illustrating the TIM on a lower surface of a heat sink and protruding wedge elements for use in lifting the heat sink during insertion or removal of the optical module, in accordance with one embodiment.
Figure 4B:
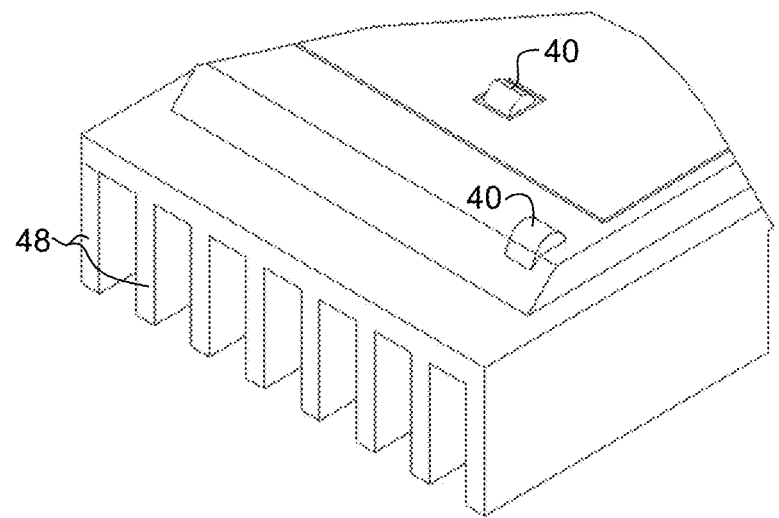
FIG. 4B is an enlarged partial view of the heat sink, TIM, and wedge elements shown in FIG. 4A.
Figure 5:
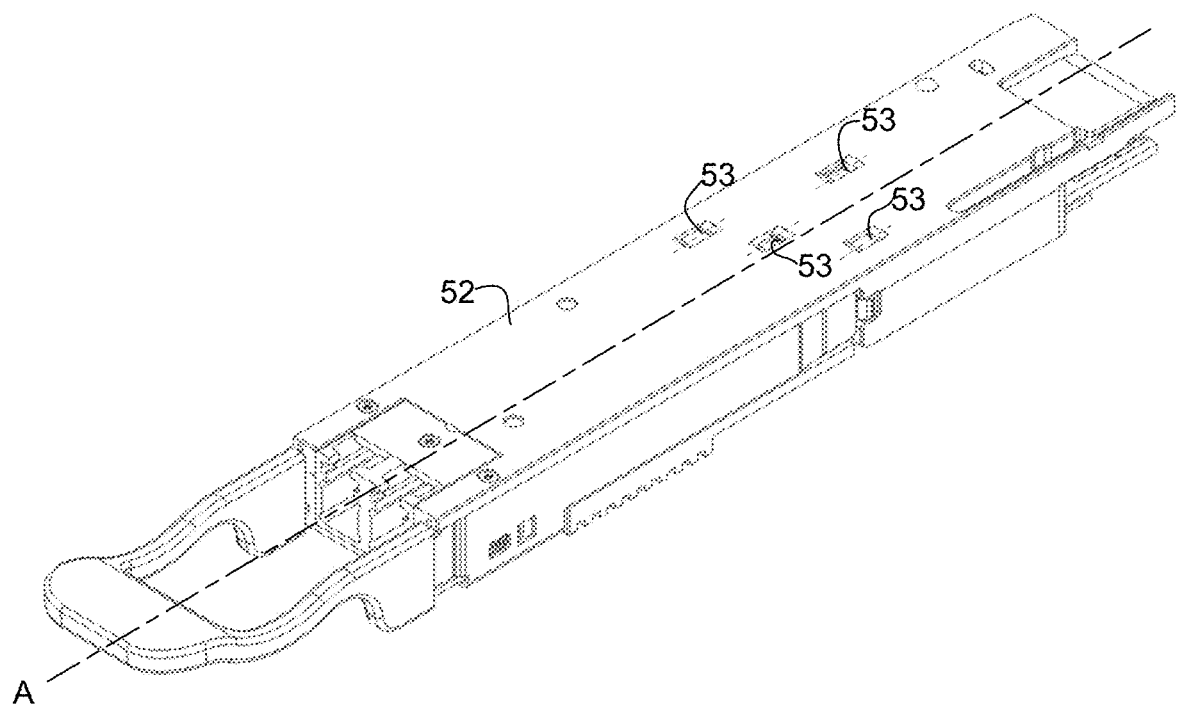
FIG. 5 is a top perspective of the optical module with grooves for receiving the wedge elements when the optical module is fully inserted into the optical module cage, in accordance with one embodiment.

FIGS. 4A-4B illustrate an example of lifting elements comprising wedge elements 40 protruding from a lower surface 42a of a heat sink 42, in accordance with one embodiment. As shown in FIG. 4A, a first lifting element 40 is positioned along a front edge of a heat sink pedestal 46 so that the heat sink 42 is lifted before the optical module reaches TIM 49. The remaining wedge elements 40 extend through openings in the TIM 49 and provide additional lift to prevent TIM damage. Any number of lifting elements 40 may be provided to create a gap between the upper surface of the optical module and the TIM as the optical module is inserted into the optical module cage, as previously described. Each of the lifting elements 40 is offset from the other elements along a width of the heat sink so that the element only falls into its final corresponding recess 53 (FIG. 5) on the optical module top cover (thermal surface) (FIGS. 4A and 5). As previously noted, the heat sink 42 may comprise any number of heat sink fins 48 in any shape or arrangement.

FIG. 5 is a perspective of an optical module 52 comprising grooves 53 for receiving the wedge elements 40 shown in FIGS. 4A and 4B. The grooves are offset from one another in a direction transverse to longitudinal axis A of the optical module 52 so that the wedge elements 40 do not snap into multiple grooves (recesses) 53 as the optical module moves longitudinally within the optical module cage (FIGS. 4A and 5). When the optical module 52 is fully inserted into the optical module cage, the wedge elements 40 snap into the corresponding grooves 53 (FIGS. 4A and 5).

In one or more embodiments, the lifting elements 40, recesses 53, upper surface of the optical module, or any combination thereof may comprise a coating (e.g., Teflon or other coating) to reduce sliding friction between the surfaces and allow for ease of insertion and removal of the optical module 52. As shown in FIG. 5, the grooves 53 include beveled sides for ease of movement of the wedges 40 into and out of the grooves.

It is to be understood that the number of lifting elements 40 and recesses 53 or arrangement of lifting elements and recesses may be different than shown without departing from the scope of the embodiments. In the examples described herein, the optical module includes four recesses corresponding to the four lifting elements on the heat sink, but there may be any number of lifting elements and corresponding recesses in any arrangement. As previously described, a first lifting element is preferably positioned along a leading edge of the heat sink pedestal so that the heat sink is lifted and the gap is created before the optical module comes in contact with the thermal interface material. The location and number of the lifting elements may be optimized based on the optical module design.

FIGS. 6A-6D illustrate insertion of the optical module 52 into an optical module cage 64 with the heat sink 42 and TIM 49, in accordance with one embodiment. The optical module cage 64 is mounted on a printed circuit board 65, as previously described.

Figure 6A:
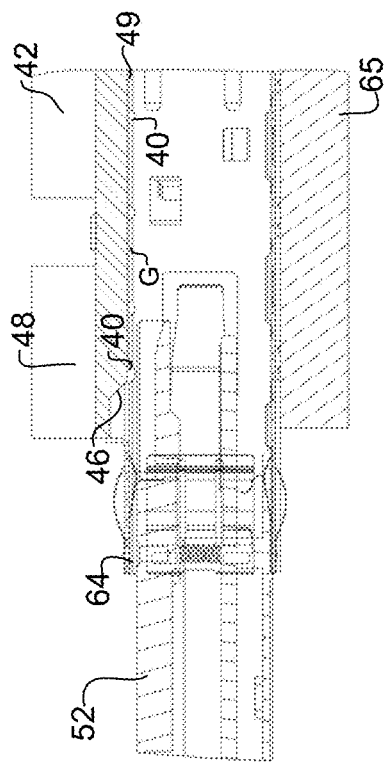
FIGS. 6A-6D are cross-sectional views illustrating insertion of the optical module of FIG. 5 into the optical module cage containing the heat sink shown in FIG. 4A.
Figure 6B:
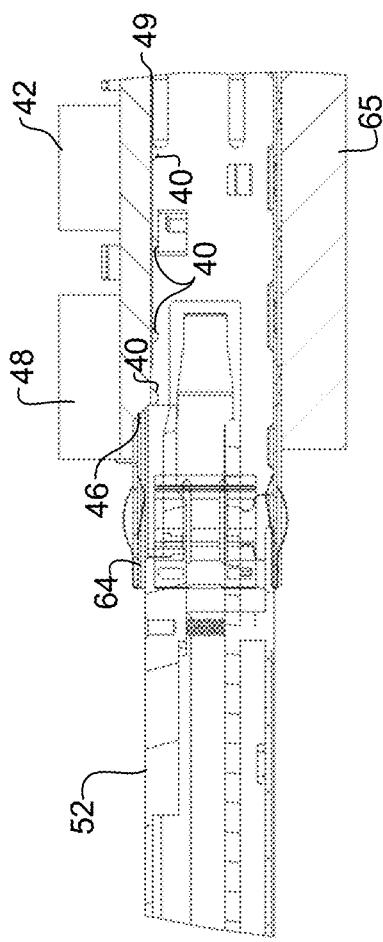
Figure 6C:
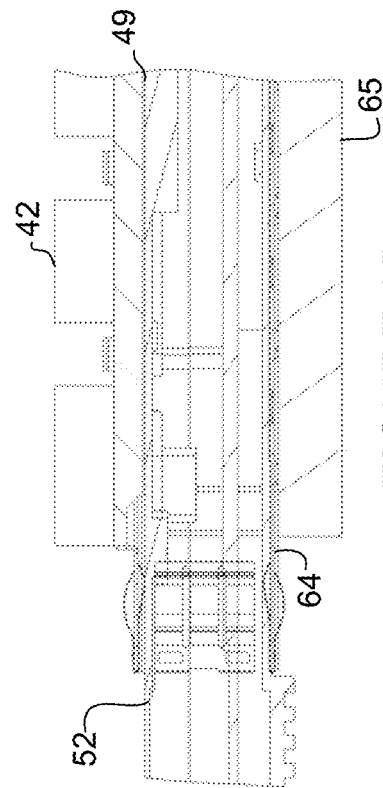
Figure 6D:
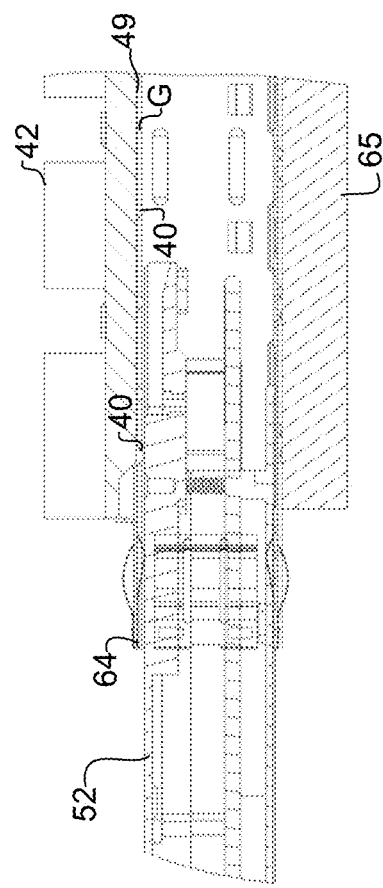

As shown in FIG. 6A, insertion of the optical module 52 begins with the right (leading) edge (as viewed in FIG. 6A) of the optical module about to contact the first lifting element 40 positioned on the heat sink pedestal 46. As the optical module 52 passes the first lifting element 40, the heat sink 42 lifts up, creating gap G (FIG. 6B). As the optical module 52 moves into the optical module cage 64 and reaches additional lifting elements 40, the heat sink 42 has additional lift to maintain the physical gap G and sufficient clearance with the TIM 49 (FIG. 6C). FIG. 6D shows the optical module 52 fully inserted (seated) in the optical module cage 64. The lifting elements 40 (not shown) are seated in the corresponding grooves on the top cover of the optical module 52. The TIM 49 is now in thermal contact with the top cover of the optical module 52 to provide an efficient heat transfer interface. A reverse process may be performed to remove the optical module 52 from the optical module cage 64 without damage to the TIM 49.

Figure 7A:
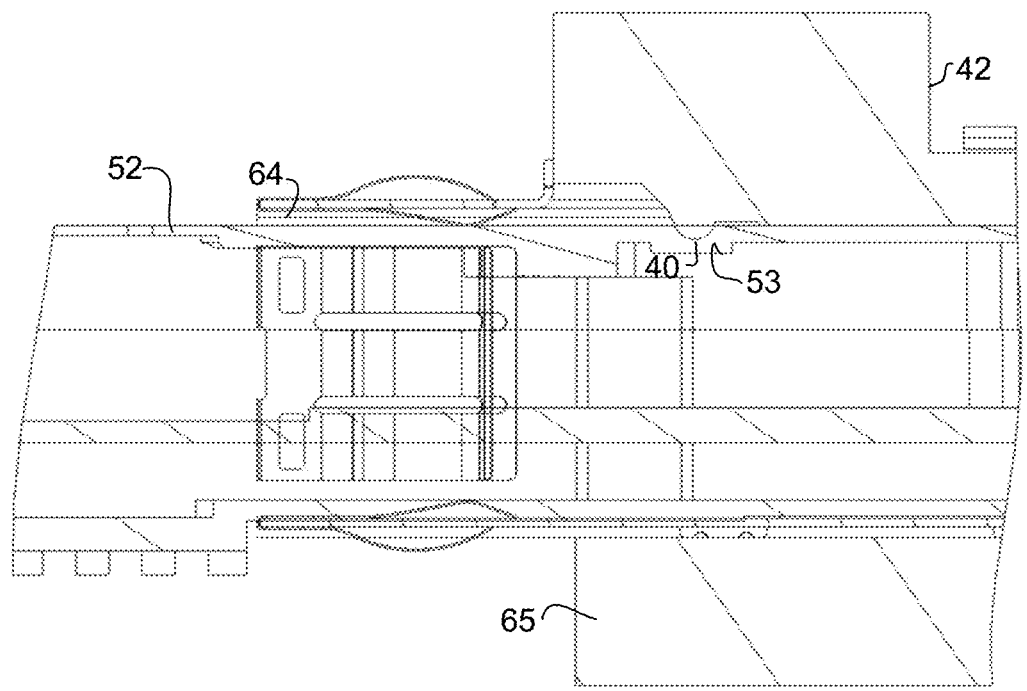
FIG. 7A is a partial side view showing details of one of the wedge elements inserted into one of the grooves with the optical module fully inserted into the optical module cage.
Figure 7B:
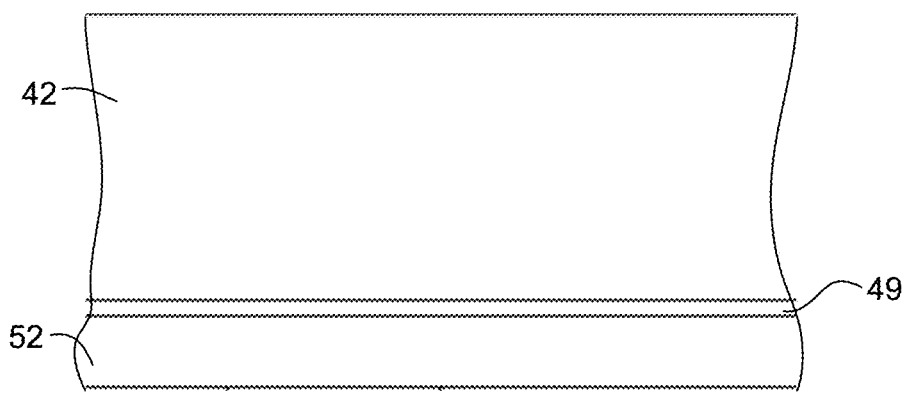
FIG. 7B is a partial side view showing a direct contact thermal interface between the optical module and TIM with the optical module fully inserted into the optical module cage.

FIG. 7A is an enlarged partial side view showing one of the lifting elements 40 inserted into its corresponding groove 53. FIG. 7B is a partial side view showing the TIM 49 at the interface between the seated heat sink 42 and fully inserted optical module 52 of FIG. 7A.

Figure 8A:
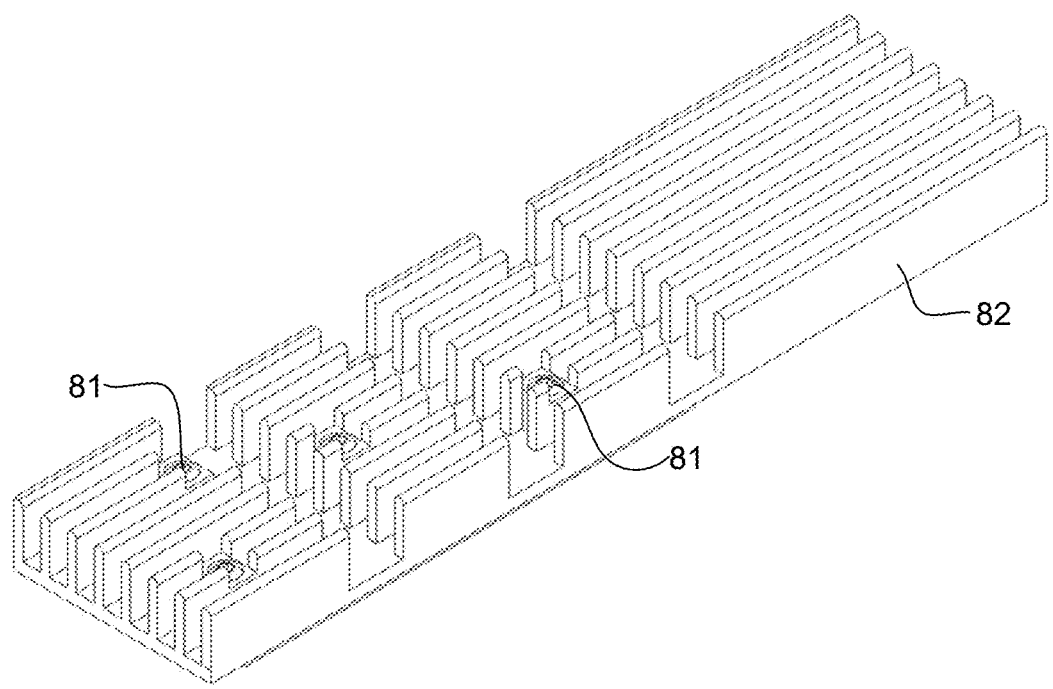
FIG. 8A is a top perspective of a heat sink with spring loaded ball elements for use in lifting the heat sink during insertion or removal of the optical module, in accordance with one embodiment.
Figure 8B:
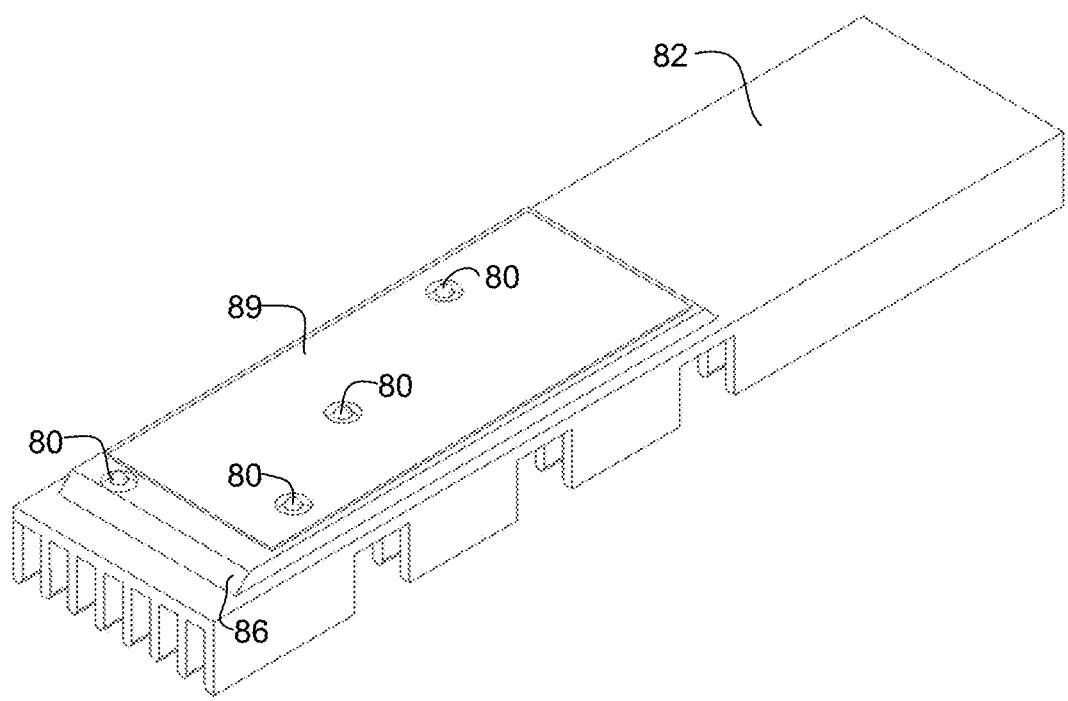
FIG. 8B is a bottom perspective of the heat sink shown in FIG. 8A.

FIG. 8A is a top perspective and FIG. 8B is a bottom perspective of a heat sink 82 with lifting elements comprising spring loaded balls 80. In this example, the wedge elements 40 of FIG. 4A are replaced with the spring loaded balls 80. As described below, the spring loaded balls 80 may comprise a press-fit or threaded cartridge inserted into openings in the heat sink 82.

Figure 9:
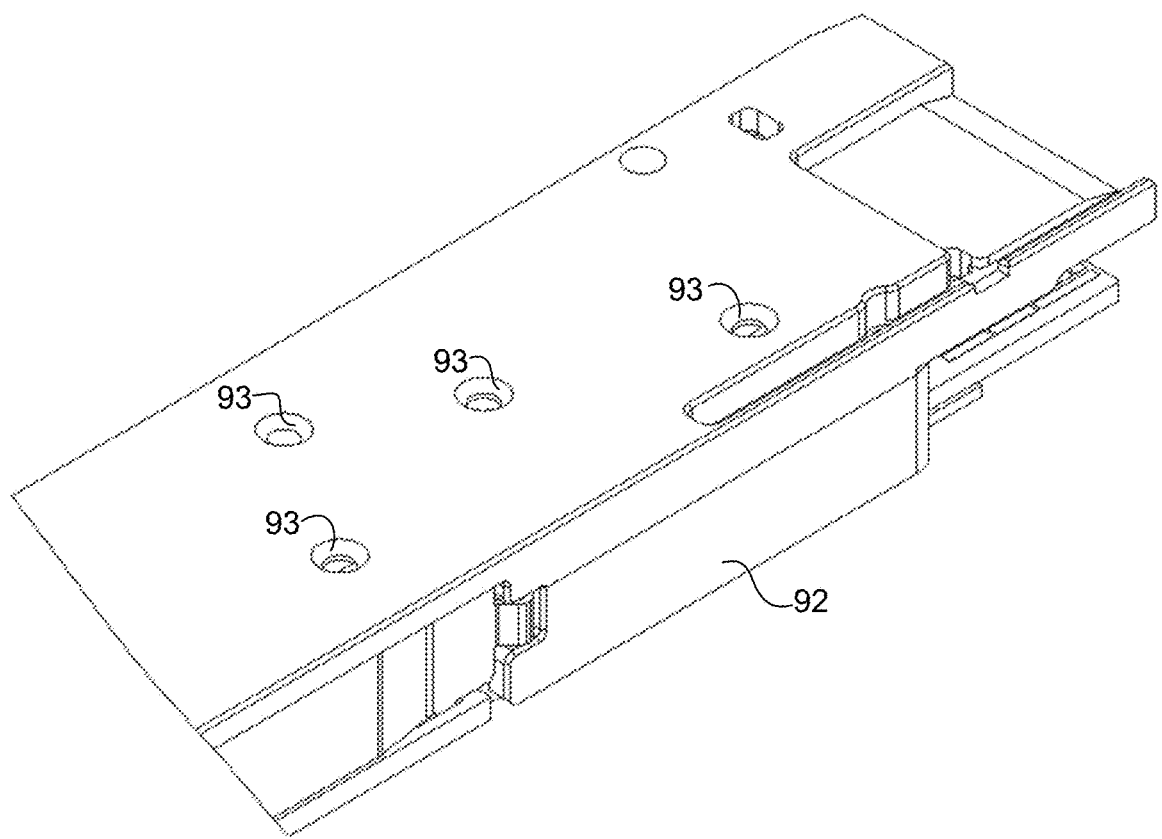
FIG. 9 is a partial top perspective of an optical module with dimples for receiving the spring loaded ball elements shown in FIG. 8B, in accordance with one embodiment.

FIG. 9 is a partial perspective of recesses (dimples) 93 for receiving the spring loaded balls 80 (FIG. 8B) on an upper surface (top cover) of optical module 92. When the balls 80 are in a compressed position, a gap is created between the upper surface of the optical module and TIM 89 attached to heat sink pedestal 86 (FIGS. 8A, 8B, and 9). When the optical module 92 is fully inserted inside the optical module cage, the spring loaded balls 80 are aligned with the corresponding dimples 93 so that the heat sink 82 is seated and the TIM 89 is in direct contact with the upper surface of the optical module 92. As previously described, the dimples 93 are offset from one another to avoid the balls snapping into multiple dimples during OIR of the optical module. The number and arrangement of the lifting elements 80 and recesses 93 shown in FIGS. 8B and 9 are only an example and other arrangements may be used.

Figure 10A:
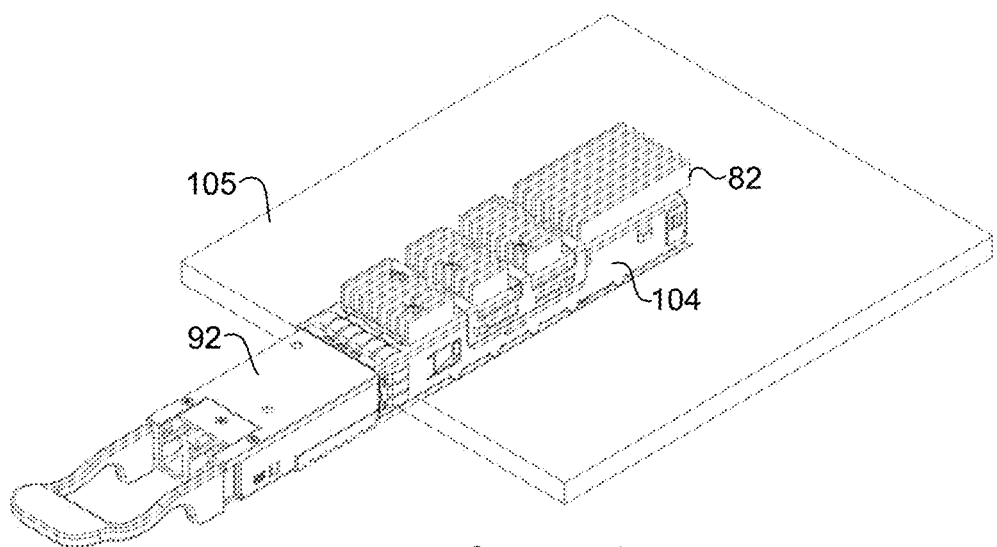
FIG. 10A is a perspective of the optical module of FIG. 9 inserted into an optical module cage with the heat sink of FIG. 8A mounted on a printed circuit board.
Figure 10B:
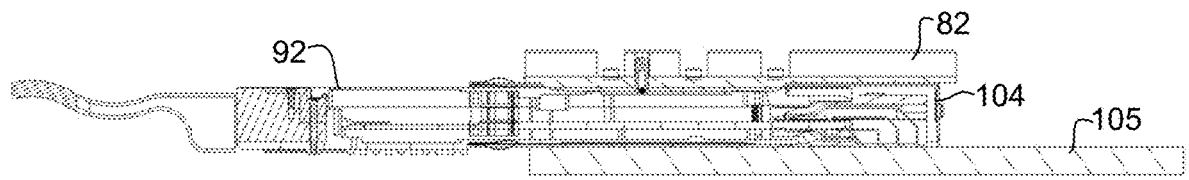
FIG. 10B is a cross-sectional side view of the optical module, optical module cage, heat sink, and printed circuit board shown in FIG. 10A.
Figure 10C:
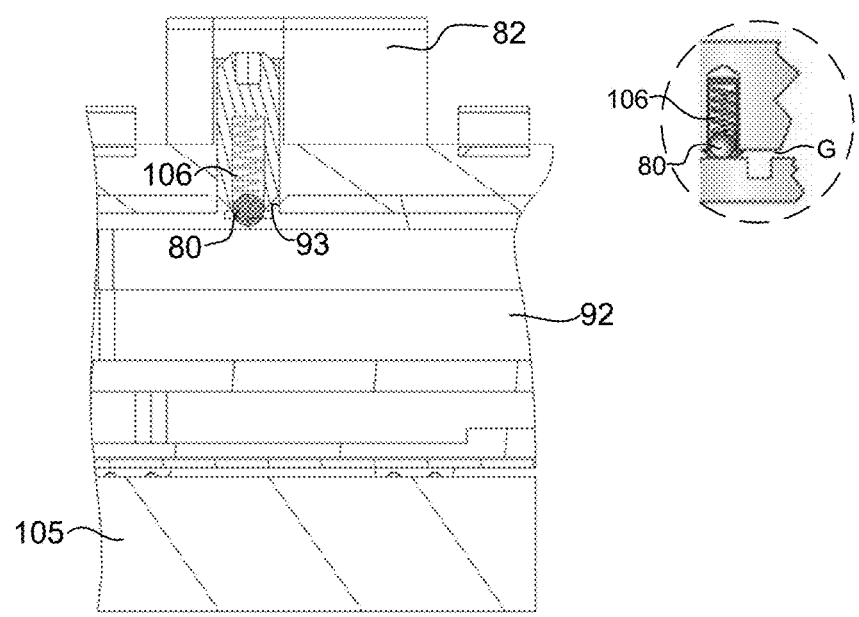
FIG. 10C is an enlarged cross-sectional view showing engagement of the ball element with the dimple on the optical module.

FIG. 10A is a perspective of the optical module 92 inserted into an optical module cage 104 with the heat sink 82 mounted on PCB 105. FIG. 10B is a side view of the assembly shown in FIG. 10A. FIG. 10C is partial cross-sectional side view illustrating details of the spring loaded ball 80 seated in the recess 93 on the optical module 92. In this example, the spring loaded ball element 80 is contained within a press fit housing comprising a spring 106 operable to force the ball into an extended position (inserted into the recess 93 as shown in FIG. 10C). The spring loaded ball 80 automatically depresses (spring compresses) as the optical module 82 is inserted into or removed from the optical module cage and the ball contacts the upper surface of the optical module to create gap G, as shown in the cut-out view of FIG. 10C. The spring loaded ball 80 snaps back into the corresponding recess 93 when the optical module 92 is fully inserted. In one example, the spring 106 or ball 80 may be formed from stainless steel for operation at higher temperatures. The spring force may be optimized by adjusting the spring cavity. The location and number of lifting elements 80 may be optimized based on heat sink dimensions, as previously noted. The spring loaded ball 80 may be configured to provide minimal loading and reduced friction. In one embodiment, a gap of 0.5-0.75 mm is maintained between the TIM 89 and top cover of the optical module 92 when the balls 80 are in their compressed state (during insertion or removal of the optical module). The physical gap distance between the TIM 89 and optical module 92 during OIR may be customized based on the type of optical module, heat sink, and TIM implemented. It is to be understood that the lifting element shown in FIG. 10C is only an example and other configurations may be used. For example, the housing may be threaded, rather than press-fit and other type of spring or plunger designs may be utilized.

Figure 11:
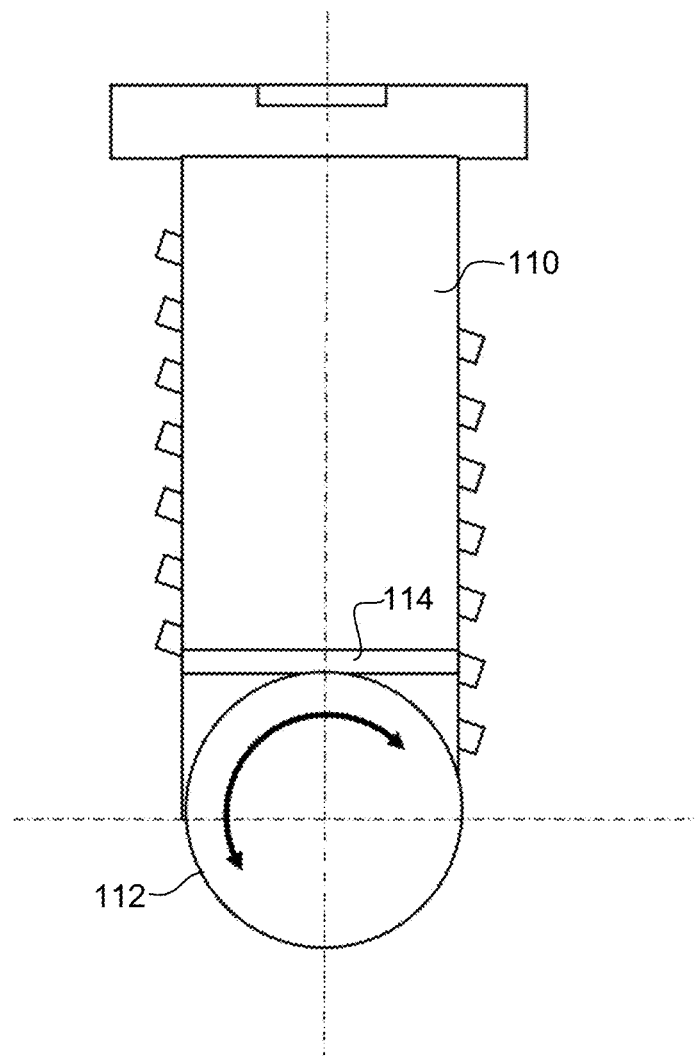
FIG. 11 is a side view of a lifting element comprising a rolling ball element, in accordance with one embodiment.

FIG. 11 illustrates another example of a lifting element comprising a rolling ball screw 110, which may be threaded or press-fit. The rolling ball screw 110 allows a ball 112 to roll at its base and provides features that prevent any other movement of the ball. As shown in the example of FIG. 11, the rolling ball screw may include a stopper pin 114. In this example, the ball 112 can only roll, all other movements are restricted. Other designs may include a press-fit slotted dowel pin inside the screw. The rolling ball screw 110 may be inserted into the heat sink as described above with respect to FIG. 8A using any suitable design and assembly process. The rolling balls 112 ensure uniform lift of the heat sink and may also reduce sliding friction, thereby improving user experience during OIR.

Figure 12A:
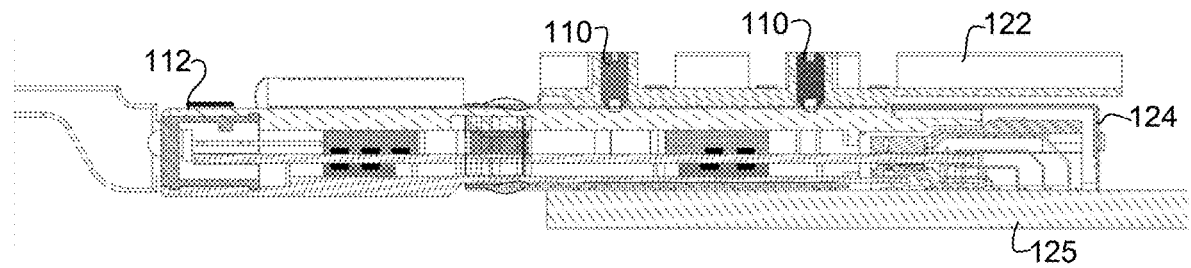
FIG. 12A is a side view of the optical module inserted into an optical module cage with a heat sink containing the rolling ball elements for use in lifting the heat sink during insertion or removal of the optical module, in accordance with one embodiment.
Figure 12B:
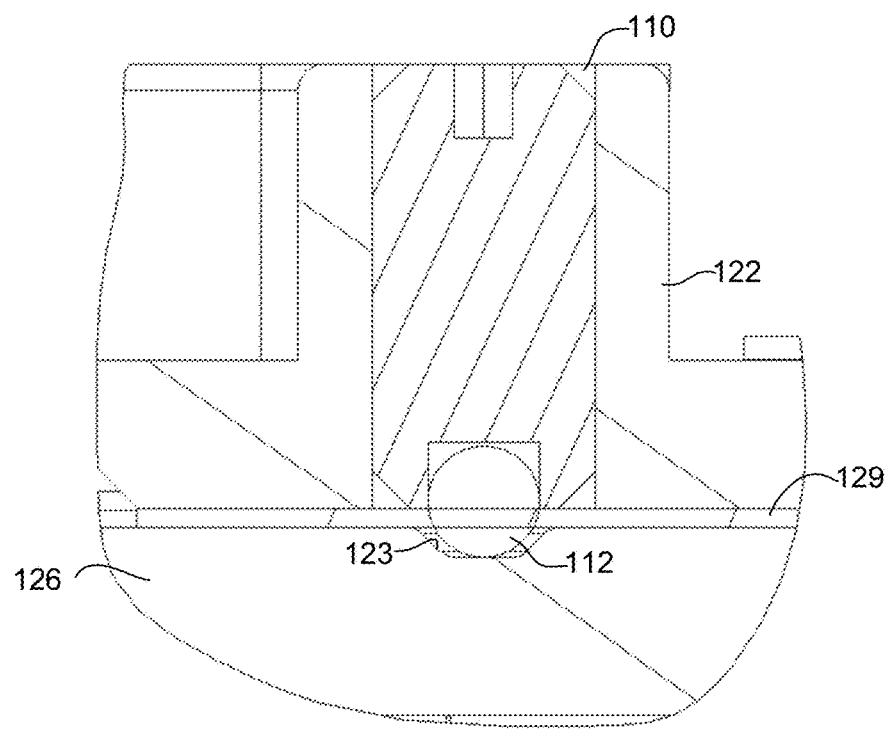
FIG. 12B is an enlarged view of the rolling ball element seated in a dimple on an upper surface of the optical module shown in FIG. 12A.

FIGS. 12A and 12B are side views of the rolling ball screw 110 with the optical module 126 fully inserted into the optical module cage 124 mounted on PCB 125. The ball element 112 is seated in its corresponding groove 123 in the optical module 126 and the TIM 129 attached to the heat sink 122 is in direct thermal contact with the optical module.

Figure 13A:
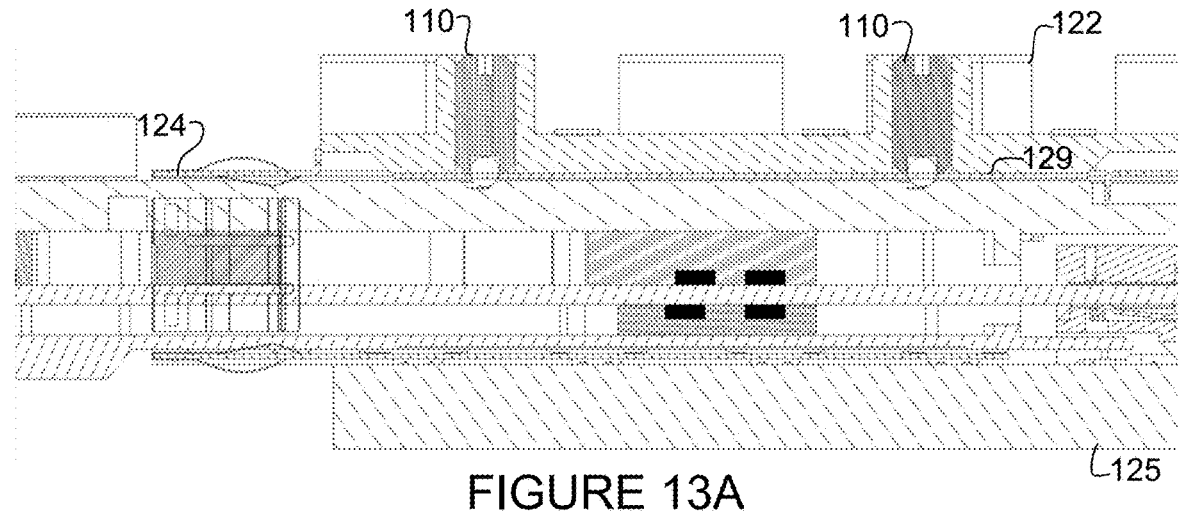
FIG. 13A is a partial side view of the assembly shown in FIG. 12A at the start of removal of the optical module from the optical module cage.
Figure 13B:
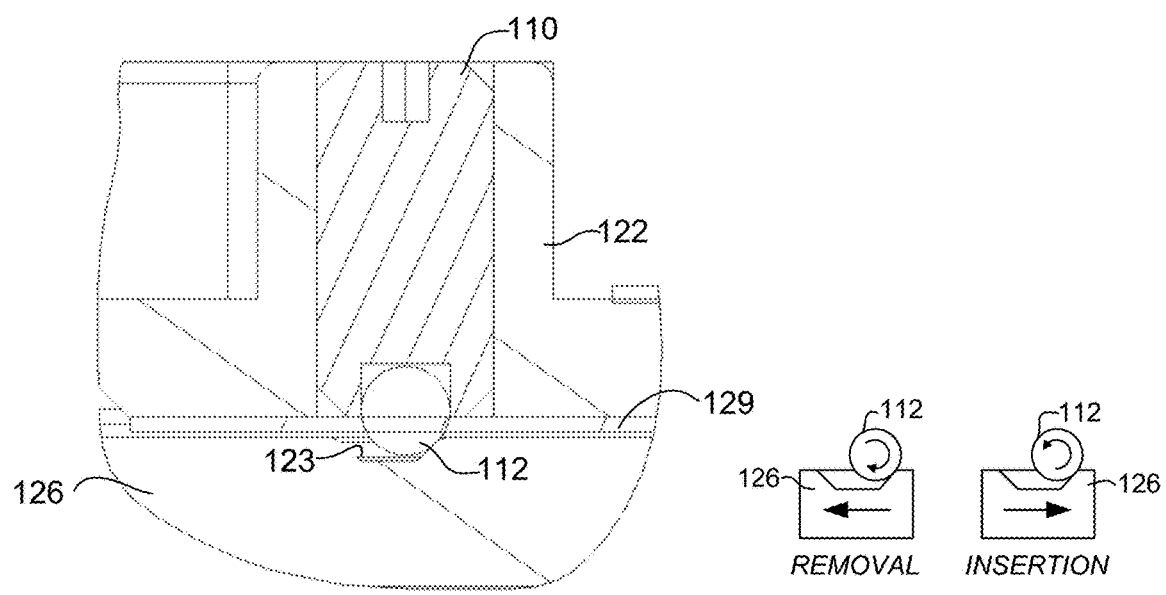
FIG. 13B is an enlarged view of the rolling ball element shown in FIG. 13A with schematics illustrating rolling direction of the ball during removal and insertion of the optical module.

FIGS. 13A and 13B are side views of the rolling ball screws 110 with movement (start of insertion or removal) of the optical module. As shown in FIG. 13B, during optical module insertion (to the right as viewed in FIG. 13B), the ball rolls counterclockwise and rolls into the groove as the screw drops down into the groove 123 with downward movement of the heatsink 122 and TIM 129. During removal of the optical module 126, the ball 112 starts to roll upward out of the groove in a clockwise direction and the screw lifts with upward movement of the heat sink 122. As the ball rolls on the upper surface of the optical module 126, the rolling ball screw 110 lifts further and maintains a uniform gap between the TIM 129 and the optical module thermal surface.

It is to be understood that the lifting elements in the heat sink and corresponding recesses in the optical module shown and described herein are only examples and other types of lifting elements and arrangement or number of lifting elements may be used without departing from the scope of the embodiments.

As can be observed from the foregoing, one or more embodiments described herein provide a cost effective solution to implement a TIM at optical module and heat sink interface to improve heat transfer from high power optics. TIM damage is prevented during OIR of the optical module, thereby improving reliability. Any suitable TIM may be used along with any form factor optical module and the design may be compatible with standard heat sink designs. In one or more embodiments, the retention clip design may be optimized so that there is no significant change in insertion or extraction forces. The location and number of lifting elements may be modified as needed for different optical module designs. The lifting elements provide a completely passive design with no user intervention needed.

Although the method and apparatus have been described in accordance with the embodiments shown, one of ordinary skill in the art will readily recognize that there could be variations made without departing from the scope of the embodiments. Accordingly, it is intended that all matter contained in the above description and shown in the accompanying drawings shall be interpreted as illustrative and not in a limiting sense.

What is claimed is:

1. An apparatus comprising:
 a heat sink for attachment to an optical module cage configured for receiving an optical module;
 a thermal interface material attached to a surface of the heat sink for thermal contact with the optical module; and
 a plurality of lifting elements extending from the surface of the heat sink;
 wherein said plurality of lifting elements are configured to create a gap between the thermal interface material and the optical module during insertion of the optical module into the optical module cage or removal of the optical module from the optical module cage, said plurality of lifting elements positioned for insertion into aligned recesses in the optical module when the optical module is fully inserted into the optical module cage to eliminate said gap and provide contact between the optical module and the thermal interface material.

2. The apparatus of claim 1 wherein the heat sink comprises a pedestal and at least one of the lifting elements is positioned along an edge of the pedestal.

3. The apparatus of claim 2 wherein remaining lifting elements of the plurality of lifting elements other than the at least one of the lifting elements positioned along the edge of the pedestal extend through openings in the thermal interface material.

4. The apparatus of claim 1 wherein said plurality of lifting elements comprise at least four lifting elements.

5. The apparatus of claim 1 wherein the lifting elements are offset from one another along a width of the heat sink.

6. The apparatus of claim 1 wherein the recesses comprise sloped edges for ease of insertion of the lifting elements into the recesses and removal of the lifting elements from the recesses during insertion and removal of the optical module.

7. The apparatus of claim 1 wherein at least one of the lifting elements or the optical module comprises a coating to reduce sliding friction between the lifting elements and the optical module.

8. The apparatus of claim 1 wherein said plurality of lifting elements comprise a plurality of wedge elements and said recesses comprise grooves.

9. The apparatus of claim 1 wherein said plurality of lifting elements comprise ball elements and said recesses comprise dimples.

10. The apparatus of claim 9 wherein the ball elements comprise spring loaded ball elements.

11. The apparatus of claim 9 wherein the ball elements comprise rolling ball elements.

12. The apparatus of claim 9 wherein the ball elements are inserted into a cartridge press-fit into the heat sink.

13. The apparatus of claim 9 wherein the ball elements are inserted into a cartridge comprising a threaded interface with the heat sink.

14. The apparatus of claim 1 wherein the heat sink comprises fins extending from a side opposite the thermal interface material.

15. The apparatus of claim 1, wherein the plurality of lifting elements are configured to contact and slide along a surface of the optical module while creating the gap between the thermal interface material and the optical module during insertion or removal of the optical module.

16. A system comprising:
 a heat sink connected to a cage;
 a thermal interface material extending over at least a portion of a surface of the heat sink;
 a plurality of lifting elements extending from the surface of the heat sink; and
 a module for insertion into the cage, the module comprising a thermal surface for contact with the thermal interface material with the module fully inserted into the cage and a plurality of recesses formed in the thermal surface;

wherein said plurality of lifting elements prevent contact between the thermal interface material and the thermal surface of the module during insertion of the module into the cage or removal of the module from the cage, and wherein the recesses are positioned for receiving the lifting elements when the module is fully inserted into the cage to provide direct contact between the thermal interface material and the thermal surface of the module.

17. The system of claim 16 wherein the module comprises an optical transceiver.

18. The system of claim 16 further comprising a retention clip for biasing the heat sink towards the module when the module is fully inserted into the cage.

19. The system of claim 16 wherein said plurality of lifting elements comprise a plurality of wedge elements and said recesses comprise grooves.

20. The system of claim 16 wherein said plurality of lifting elements comprise ball elements and said recesses comprise dimples.

21. A network device comprising:

a plurality of optical module cages; and a plurality of heat sinks connected to the optical module cages, each of the heat sinks comprising a thermal interface material on a surface of the heat sink for thermal contact with a surface of an optical module when the optical module is fully inserted in one of the optical module cages, and a plurality of lifting elements extending from the surface of the heat sink;

wherein said plurality of lifting elements are configured to create a gap between the thermal interface material and the optical module during insertion of the optical module into the optical module cage or removal of the optical module from the optical module cage, said plurality of lifting elements positioned for insertion into aligned recesses in the optical module when the optical module is fully inserted in the optical module cage to eliminate said gap and provide contact between the optical module and the thermal interface material.

* * * * *